United States Patent [19]

Schnizlein

[11] Patent Number: 4,950,928
[45] Date of Patent: Aug. 21, 1990

[54] DYNAMIC PLA CIRCUIT WITH NO "VIRTUAL GROUNDS"

[75] Inventor: Paul G. Schnizlein, Austin, Tex.

[73] Assignee: Advanced Micro Devices, Inc., Sunnyvale, Calif.

[21] Appl. No.: 407,000

[22] Filed: Sep. 14, 1989

[51] Int. Cl.[5] .......................................... H03K 19/177
[52] U.S. Cl. ................................. 307/468; 307/443; 307/465; 307/469; 307/481
[58] Field of Search ................ 307/443, 465, 468–469, 307/481, 452

[56] References Cited

U.S. PATENT DOCUMENTS

| | | | |
|---|---|---|---|
| 4,467,439 | 8/1984 | Rhodes | 307/465 X |
| 4,516,123 | 5/1985 | Shoji | 307/468 X |
| 4,557,190 | 3/1986 | Law | 307/468 X |
| 4,661,728 | 4/1987 | Kashimura | 307/468 |
| 4,740,721 | 4/1988 | Chung et al. | 307/481 X |
| 4,769,562 | 9/1988 | Ghisio | 307/481 X |
| 4,857,767 | 8/1989 | Little et al. | 307/468 X |

Primary Examiner—David Hudspeth
Attorney, Agent, or Firm—Davis Chin

[57] ABSTRACT

A dynamic programmable logic array circuit includes an AND logic plane (12), an inter-plane buffer (22), and an OR logic plane (14). The inter-plane buffer (22) is formed of a plurality of N-channel inter-plane FETs. Each of the plurality of N-channel inter-plane FETs has its gate electrode connected to a respective one of a plurality of product term lines and its source electrode connected to a respective one of a plurality of OR plane input lines. The drain electrodes of the plurality of inter-plane FETs are connected to receive an OR plane evaluation signal.

9 Claims, 3 Drawing Sheets

DYNAMIC PLA CIRCUIT WITH NO "VIRTUAL GROUNDS"

BACKGROUND OF THE INVENTION

1. Field of the Invention

This invention relates generally to programmable logic array circuitry and more particularly, it relates to an improved dynamic PLA circuit with no "virtual grounds" for generating a faster high-to-low transition on its product term lines than has been traditionally available.

2. Description of the Prior Art

Programmable logic arrays (PLAs) are generally known as a method of implementing logic in complex digital circuits. PLAs typically have a two "plane" structure wherein there are provided two separate regions or groupings of logic gates with the outputs of one region being fed into the inputs oF the other region. For example, a basic PLA structure is comprised of a plane of AND gates reFerred to sometimes as an AND array or product term array and a plane of OR gates sometimes referred to as an OR array or sum term array. This type of two-plane PLA allows a large number of arbitrary logic operations to be implemented in an orderly manner. The orderly structure of programmable logic arrays is particularly advantageous when it comes to designing large scale integrated (LSI) circuits or very large scale (VLSI) circuits.

The logic operations implemented in the "AND" and "OR" planes of the conventional programmable logic arrays are typically performed by MOS (metal-oxide semiconductor) FETs (field-effect transistors) connected to the input lines and output lines thereof, and interconnected by means of product term lines which join the outputs of the "AND" plane MOS devices to the inputs of the "OR" plane MOS devices. A prior art arrangement of this type is shown in FIG. 1. Here, the AND plane is designated by reference numeral 1 and the OR plane is designated by reference numeral 2. The input signals IN1, $\overline{IN1}$ ... are set up on the input lines 3 while the AND plane is precharging (the evaluation signal AND eval/$\overline{pch}$ is at a low level). During this time, the FET MAG1 is turned off and the virtual ground on line 4 is allowed to float up via the programming FETs A1, A2, ... whose inputs are at a high level. During the evaluation phase when the signal AND eval/$\overline{pch}$ is at a high level, the transistor MAG1 is turned on which connects the virtual ground line 4 to the ground potential.

Terms whose respective programming FETs are turned on by the input signals being at a high level will be discharged through the transistor MAG1 to the ground potential. Thus, a large discharge current, accompanied by increased power consumption, will be generated due to all of the charges on the various terms as well as the charge on the virtual ground parasitic capacitance C. It would therefore be desirable to reduce this discharge current by eliminating the virtual ground and reducing the capacitance on the term lines 6. The term line capacitance is created by the connection of the drain electrodes of the programming FETs A1, A2, ... to the respective one of the term lines 6.

The terms which do not have a path to the ground potential will remain charged to the high level. When the OR plane 2 is being evaluated the evaluation signal OR eval/$\overline{pch}$ is at a high level), the transistor MAG2 is turned on which connects the virtual ground line 7 to the ground potential. The term lines having the high level will cause the programming FETs B1, B2, ... in the OR plane to be turned on, thereby discharging some of the output lines B. However, the high-to-low transition on the output lines B and the virtual ground line 7 will be coupled capacitively to the term lines (now floating) having a high level. As a result, the term lines will also make a high-to-low transition which is referred to as "term line degradation."

This coupling is created by the gate oxide capacitance of the programming FETs B1, B2, ... in the OR plane which are turned on. The amount of degradation depends upon the ratio of the gate oxide capacitance to the total term line capacitance. If a number of outputs are programmed for a particular term, the ratio may be quite significant. A consequence of such unwanted gate oxide capacitance is the degradation of the term line to a low enough level causing slow discharge of the output lines B and thus slows the evaluation of the OR plane.

One known technique used to overcome the problem of capacitive coupling is the addition of a buffer 9 (shown in phantom in FIG. 1) consisting of two series-connected inverters for each term line interconnected between the output of the AND plane and the input of the OR plane. This arrangement suffers from the drawbacks of requiring four FETs for each term line which increases use of chip area and thus increases manufacturing costs.

In addition, further details of other known programmable logic array devices were uncovered in a state of the art search directed to the subject matter of this application. The following U.S. Pat, Nos. were developed:

| | |
|---|---|
| 4,041,458 | 4,728,827 |
| 4,516.040 | 4,740.721 |
| 4,516,123 | 4,745,307 |
| 4,546,273 | 4,760,290 |
| 4,661,728 | 4,783,606 |

In U.S. Pat. No. 4,661,728 issued to M. Kashimura on Apr. 28, 1987, there is disclosed in FIG. 3 a programmable logic array which includes a product term (AND) array 1 and a sum term (OR) array 2. The product term array 1 is formed of a plurality of N-channel transistors connected in series to each of the term lines. The product term array 1 is coupled to a sampling circuit 3. The sum term array 2 is formed of a plurality of N-channel transistors connected in parallel to each of the corresponding input ends thereof. The product term output terminals $P_1$ to $P_m$ are connected to gate electrodes of P-channel control transistors $10_1$ to $10_m$, respectively. The source electrodes of the control transistors are coupled to a power source VDD. and the drain electrodes thereof are coupled to respective input lines $20_1$ to $20_m$ of the sum term array 2.

The sum term lines $30_1$ to $30_m$ are coupled to the power source VDD via P-channel precharge transistors $40_1$ to $40_m$. A plurality of P-channel precharge transistors $11_1$ to $11_m$ are coupled to the respective product term output terminals $P_1$ to $P_m$. A circuit 4 formed of N-channel transistors is coupled to the sum term array 2. The circuit 4 is used to maintain the input lines $20_1$ to $20_m$ of the sum term array 2 at a low level during the precharge cycle.

The present invention represents an improvement over the prior art illustrated in FIG. 1 of the drawings and the prior art of U.S. Pat. No. 4,661,728. None of the prior art discussed above disclose a dynamic programmable logic array circuit with no "virtual grounds" like that of the present invention. In particular, the dynamic programmable logic array circuit of the instant invention includes an AND logic plane, an inter-plane buffer, and an OR logic plane. The inter-plane buffer is formed of a plurality of N-channel inter-plane FETs. Each of the plurality of N-channel inter-plane FETs has its gate electrode connected to a respective one of product term lines, and its source electrode connected to a respective one of OR input lines. The drain electrodes of the inter-plane FETs are connected to receive an OR plane evaluation signal.

SUMMARY OF THE INVENTION

Accordingly, it is a general object of the present invention to provide an improved dynamic PLA circuit with no "virtual grounds" which is relatively simple and economical to manufacture and assemble, but yet overcomes the disadvantages of the prior art programmable logic array devices.

It is an object of the present invention to provide a dynamic PLA circuit with no "virtual grounds" for generating a faster high-to-low transition on its product term lines than has been traditionally available.

It is another object of the present invention to provide an improved dynamic PLA circuit which is capable of operating at higher speeds, has lower power dissipation, and has reduced power supply noise.

It is still another object of the present invention to provide a dynamic PLA circuit which reduces the discharge current by eliminating the virtual ground and by reducing the capacitance on product term lines.

In accordance with these aims and objectives, the present invention is concerned with the provision of a dynamic programmable logic array circuit which includes an AND logic plane, an inter-plane buffer, and an OR logic plane. The AND logic plane receives input logic signals and performs predetermined logic operations thereon and generates first output signals on a plurality of product term lines. The inter-plane buffer receives the first output signals and generates second input logic signals on a plurality of OR input lines. The OR logic plane receives the second input logic signals and performs a second predetermined logic operation thereon and generates second output signals on a plurality of sum term lines.

The inter-plane buffer is formed of a plurality of N-channel inter-plane transistors. Each of the plurality of N-channel inter-plane transistors has its gate electrode connected to a respective one of the plurality of product term lines and its source electrode connected to a respective one of the plurality of OR input lines. The drain electrodes of the plurality of inter-plane transistors are connected to receive an OR plane evaluation signal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 1:
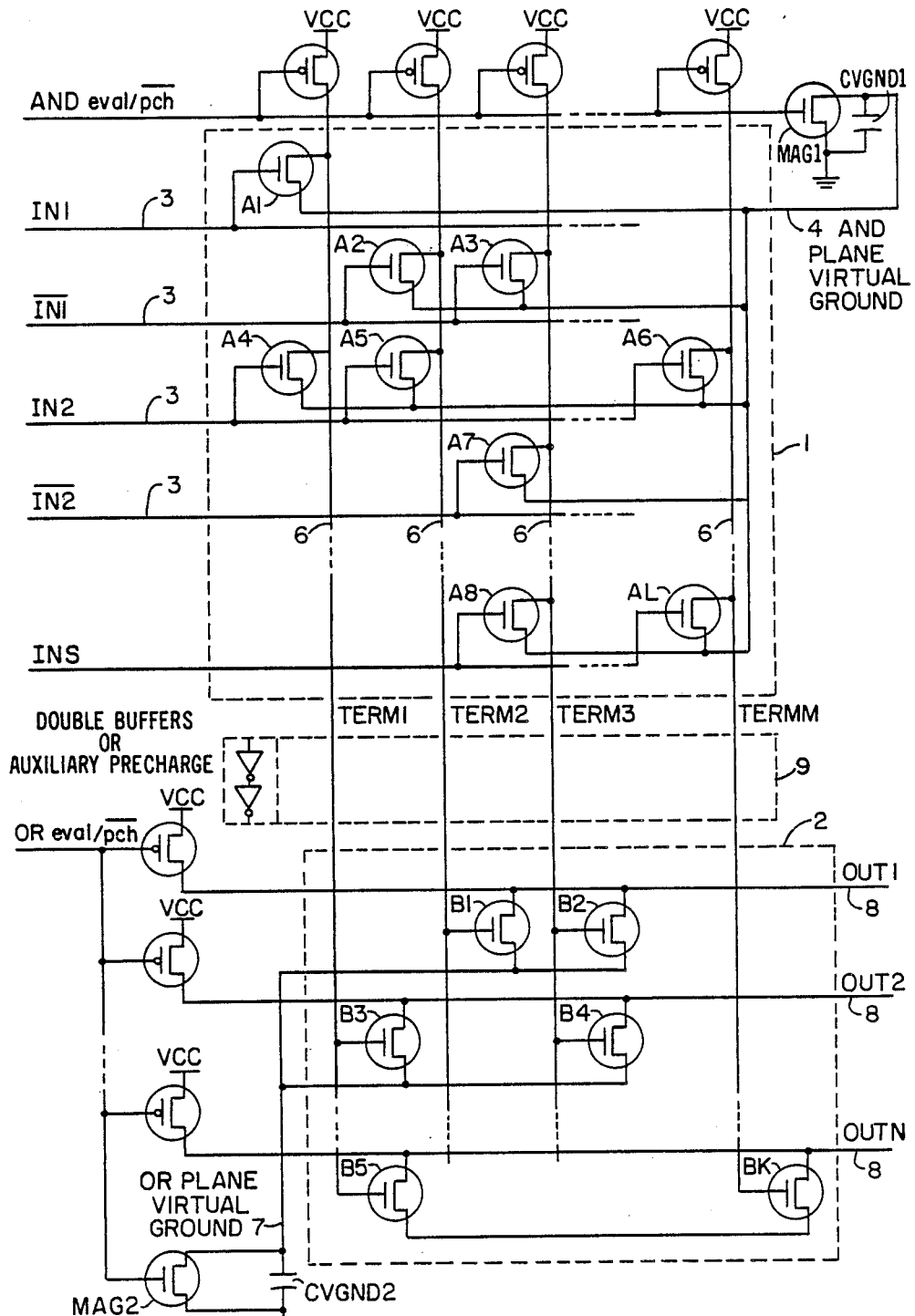
FIG. 1 is a schematic diagram of a prior art programmable logic array.
Figure 2:
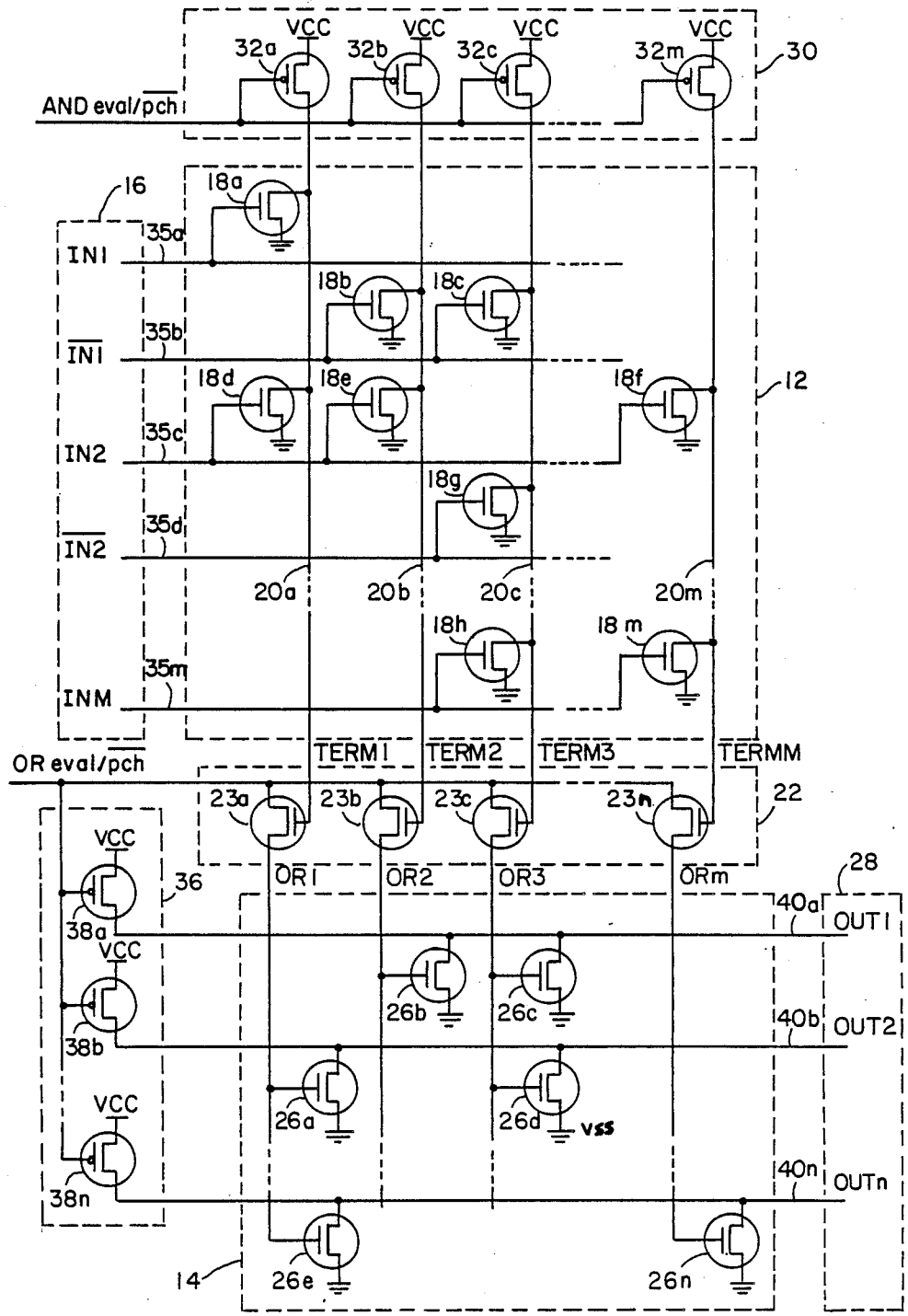
FIG. 2 is a schematic diagram of a dynamic programmable logic array, constructed in accordance with the principles of the present invention.

Referring now in detail to FIG. 2 of the drawings, there is illustrated a schematic diagram of a programmable logic array circuit 10 constructed in accordance with the principles of the present invention. The programmable logic array circuit 10 includes two separate planes or arrays of logic gates, namely an AND plane 12 and an OR plane 14, for implementing desired logic equations on input logic signals IN1, $\overline{IN1}$, . . . provided at inputs 16. The AND plane 12 receives the input logic signals provided at the inputs 16 from other circuitry external to the programmable logic array circuit 10.

The input logic signals IN1, $\overline{IN1}$, . . . are propagated through the AND plane 12 which consists of a plurality of N-channel programming FETs 18a, 18b, . . . and generates output signals TERM1, TERM2, . . . on respective product term lines 20a, 20b, . . . . These output signals TERM1, TERM2, . . . from the AND plane 12 are fed as inputs to an inter-plane buffer 22. The inter-plane buffer 22 is adapted to receive the output signals TERM1, TERM2, . . . from the AND plane and to generate OR input logic signals OR1, OR2, . . . on respective input lines 24a, 24b, . . . . The OR plane 14, which consists of a plurality of N-channel programming FETs 26a, 26b, . . . receive the input signals OR1, OR2, . . . from the buffer 22 and provides output signals OUT1, OUT2, . . . at respective outputs 28.

An AND plane precharge circuit 30 is coupled to the AND plane 12. The AND plane precharge circuit 30 is comprised of a plurality of P-channel precharge FETs 32a, 32b, . . . . Each of the precharge FETs 32a, 32b, . . . has its source electrode connected to a supply voltage or potential VCC and its drain electrode connected to a respective one of the product term lines 20a, 20b, . . . . The gate electrodes of the P-channel precharge FETs 32a, 32b, . . . are connected to a control line 34 for receiving a first control or evaluation signal AND eval/$\overline{pch}$. Each of the N-channel programming FETs 18a, 18b, . . . of the AND plane 12 has its drain electrodes connected also to a respective one of the product term lines 20a, 20b, . . . and it source electrode connected to a power supply ground potential VSS. The gate electrodes of the programming FETs 18a, 18b, . . . are connected to receive the respective ones of the input logic signals IN1, IN1, . . . via input lines 35a, 35b, . . .

An OR plane precharge circuit 36 is coupled to the OR plane 14. The OR plane precharge circuit 36 is comprised of a plurality of P-channel precharge FETs 38a, 38b, . . . . Each of the precharge FETs 38a, 38b, . . . has its source electrode connected to the supply potential VCC and its drain electrode connected to the outputs 28 of the programming logic array circuit 10 via sum term lines 40a, 40b, . . . . The gate electrodes of the P-channel FETs 38a, 38b, . . . are connected to a control line 42 for receiving a second control or evaluation signal OR eval/$\overline{pch}$. Each of the N-channel programming FETs 26a, 26b, . . . of the OR plane 14 has its drain electrode connected also to a respective one of the sum term lines 40a, 40b, . . . and its source electrode connected to these power supply ground potential VSS.

The inter-plane buffer 22 is comprised of a plurality of N-channel inter-plane FETs 23a, 23b, .... Each of the inter-plane FETs 23a, 23b, ... is associated and corresponds with one of the plurality of product term lines 20a, 20b, .... In particular, the gate electrodes of the inter-plane FETs 23a, 23b, ... is connected to a respective one of the product term lines 20a, 20b, .... Each of the inter-plane FETs 23a, 23b, ... has its drain electrode connected to the control line 42 for receiving the second control or evaluation signal OR eval/pch and its source electrode connected to provide a respective one of the input signals OR1, OR2, ... for the OR plane on the input lines 24a, 24b, ....

Figure 3:
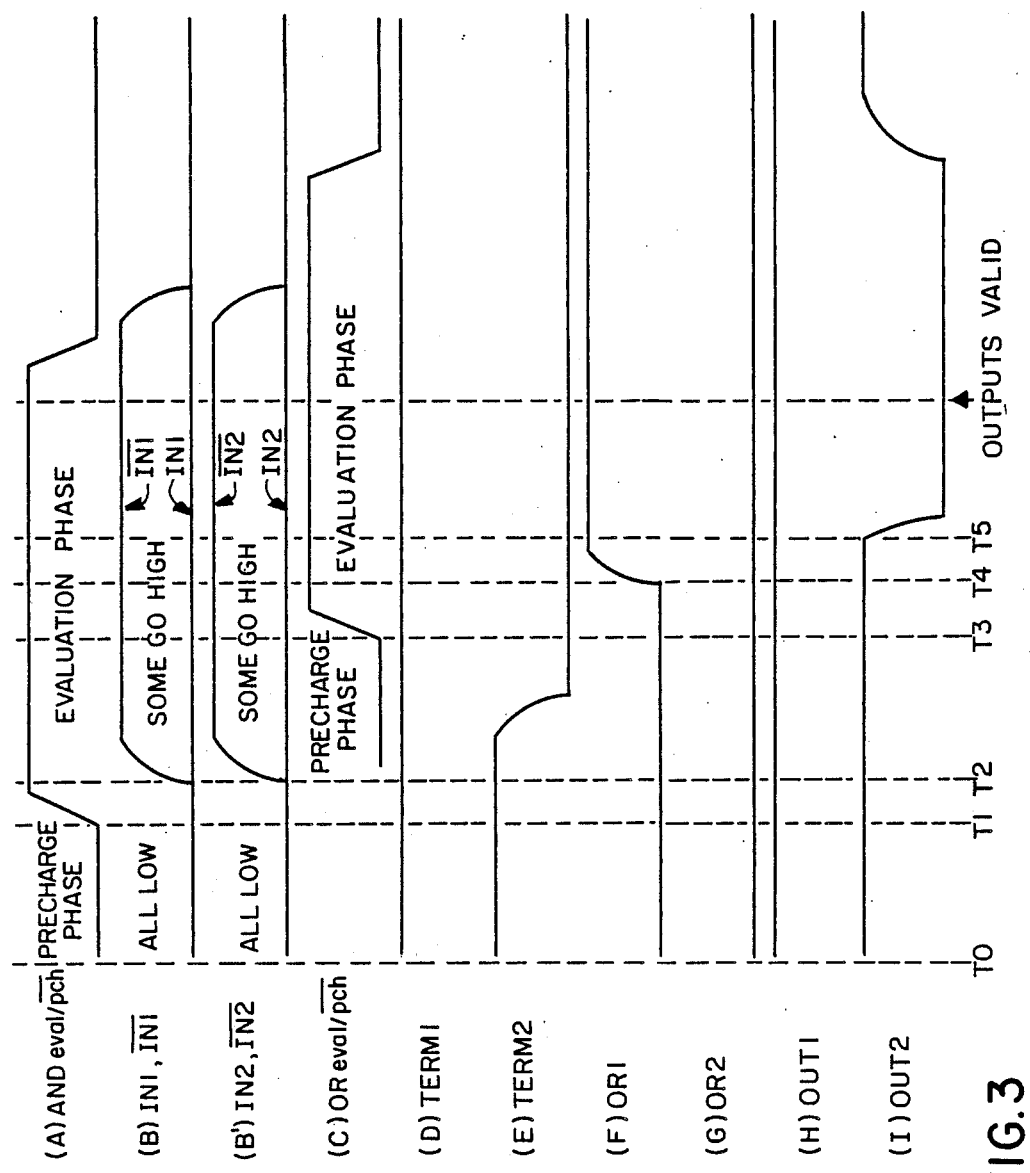
FIG. 3(a)–3(i) are waveforms useful in understanding the operation of FIG. 2.

In order to provide an understanding of the operation of the programmable logic array circuit 10 of the present invention, reference is now made to FIG. 3 of the drawings which illustrates the waveforms appearing at various points in the circuit of FIG. 2. Initially, it is assumed that all of the input logic signals IN1, $\overline{IN1}$, ... on the input lines 35a, 35b, ... are at the low or logic "0" level at time t0. This is shown in FIG. 3(b). During a precharging phase of the first evaluation signal AND eval/pch, the first evaluation signal on the line 34 is at a low or logic "0" level. During an evaluation phase of the first evaluation signal, the first evaluation signal is at a high or logic "1" level. This is shown in FIG. 3(a). Similarly, during a precharging phase of the second evaluation signal OR eval/pch, the second evaluation signal on the line 42 is at a low or logic "0" level. During an evaluation phase of the second evaluation signal, the second evaluation signal is at a high or logic "1" level. This is illustrated in FIG. 3(c).

It should be noted that all of the input logic signals IN1, $\overline{IN1}$, ... must be conditioned to the low logic level during the precharge phase of the first evaluation signal in order to prevent D.C. current flow and thus increased power dissipation. Accordingly, all of the programming FETs 18a, 18b, ... are turned off at the time t0. Thus, the input logic signals are applied to the respective input lines only after the first evaluation signal has entered the evaluation phase. Further, it should be clear that the second evaluation signal is delayed with respect to the first evaluation signal such that the evaluation phase of the second evaluation signal is generated only after the AND plane 12 has been evaluated with the input logic signals applied.

During the precharge phases of the first and second evaluation signals at the time t0, both the product term lines 20a, 20b, ... 20m and the sum term lines 40a, 40b, ... 40n are precharged to the supply potential VCC. Thus, all of the gates of the inter-plane FETs 23a, 23b, ... 23n will be at a high level so as to turn them on. As a result, the gates of the programming FETs 26a, 26b, ... 26n in the OR plane will be at the low level. Since the second evaluation signal is still in the precharging phase at this time t1, the input signals OR1 and OR2 will be discharged to ground, thereby preventing D.C. current flow in the OR plane. The waveforms of the output signals TERM1 and TERM2 on the product term lines 20a and 20b are shown in FIGS. 3(d) and 3(e), respectively. The waveforms of the input signals OR1 and OR2 on the input lines 24a and 24b are shown in FIGS. 3(f) and 3(g), respectively.

At time t1, the AND plane 12 is evaluated by the first evaluation signal going to the high level. Some of the input logic signals are made high at time t2. It will be assumed that the input logic signal IN1 is low and the input logic signal $\overline{IN1}$ is high.

Therefore, at the time t2 the programming FET 18a will remain turned off and the output signal TERM1 on the line 20a will remain at the high level. This will cause the inter-plane FET 23a to remain on. However, the programming FET 18b will be turned on so as to discharge the output signal TERM2 on the line 20b. This will cause the inter-plane FET 23b to be turned off. At time t3, the OR plane 14 is evaluated by the second evaluation signal going to the high level. Since the inter-plane FET 23b is already turned off, the input signal OR2 on the input line 24b will remain at the low level. However, the inter-plane FET 23a being turned on will cause the input signal OR1 on the FET line 24a to begin charging to the high level of the second evaluation signal OR eval/pch at time t4. As a result, the programming FET 26a will be turned on causing the output signal OUT2 on the sum term line 40b to begin discharging at time t5.

Accordingly, the programmable logic array circuit of the present invention has the following advantages over the prior art, as follows:

(1) it has eliminated the virtual grounds in both the AND plane and OR plane, thereby reducing the amount of evaluation current which contributes to increased power dissipation and power supply noise;

(2) it uses a single inter-plane FET for each product term line so as to reduce the parasitic capacitance associated therewith; and (3) it has a faster speed of operation.

From the foregoing detailed description, it can thus be seen that the present invention provides an improved dynamic programmable logic array circuit which has no virtual grounds so as to generate a faster high-to-low transition on its product term lines. This is achieved by the use of a single inter-plane FET for each product term line for coupling the AND plane to the OR plane, thereby reducing the parasitic capacitance associated therewith.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A dynamic programmable logic array circuit comprising:

AND logic plane means (12) for receiving input logic signals and performing predetermined logic operations thereon and for generating first output signals on a plurality of product term lines;

said AND logic plane means (12) being formed of a plurality of N-channel AND plane programming transistors (18a, 18b, ... 18m), each of said AND plane programming transistors having its drain electrode connected to a respective one of said plurality of product term lines and its source electrode connected to a power supply ground potential (VSS), the gate electrodes of said AND plane programming transistors being connected to receive a respective one of said input logic signals;

inter-plane buffer means (22) for receiving said first output signals and for generating second input logic signals on a plurality of OR input lines;

OR logic plane means (14) for receiving said second input logic signals and for performing a second predetermined logic function thereon and for generating second output signals on a plurality of sum term lines;

said OR logic plane means (14) being formed of a plurality of N-channel OR plane programming transistors (26a, 26b, . . . 26n), each of said OR plane programming transistors having its drain electrode connected to a respective one of said plurality of sum term lines and its source electrode connected to the power supply ground potential (VSS); and said buffer means (22) being formed of a plurality of N-channel inter-plane FETs (23a, 23b, . . . 23n), each of said plurality of interplane FETs having its gate electrode coupled to a respective one of said plurality of product term lines and its source electrode connected to a respective one of said plurality of OR input lines, the drain electrodes of said plurality of inter-plane FETs being connected to receive an OR plane evaluation signal.

2. A dynamic programmable logic array circuit as claimed in claim 1, further comprising AND plane precharging means (30) for precharging said plurality of product term lines during a precharging phase of an AND phase evaluation signal.

3. A dynamic programmable logic array circuit as claimed in claim 2, wherein said AND plane precharging means (30) comprises a plurality of P-channel AND plane precharging transistors (32a, 32b, . . . 32m), each of said plurality of AND plane precharging transistors having its source electrode connected to a supply potential (VCC) and its drain electrode connected to a respective one of said plurality of product term lines, the gate electrodes of said plurality of AND plane precharging transistors being connected to receive said AND plane evaluation signal.

4. A dynamic programmable logic array circuit as claimed in claim 1, further comprising OR plane precharging means (36) for precharging said plurality of sum term lines during a precharging phase of said OR plane evaluation signal.

5. A dynamic programmable logic array circuit as claimed in claim 4, wherein said OR plane precharging means (34) comprises a plurality of P-channel OR plane precharging transistors (38a, 38b, . . . 38n), each of said plurality of OR plane precharging transistors having its source electrode connected to a supply potential (VCC) and its drain electrode connected to a respective one of said plurality of sum term lines, the gate electrodes of said plurality of OR plane precharging transistors being connected to receive said OR plane evaluation signal.

6. A dynamic programmable logic array circuit comprising:

AND logic plane means (12) for receiving input logic signals and performing predetermined logic operations thereon and for generating first output signals on a plurality of product term lines;

said AND logic plane means (12) being formed of a plurality of N-channel AND plane programming transistors (18a, 18b, . . . 18m), each of said AND plane programming transistors having its drain electrode connected to a respective one of said plurality of product term lines and its source electrode connected to a power supply ground potential (VSS), the gate electrodes of said AND plane programming transistors being connected to receive a respective one of said input logic signals;

inter-plane buffer means (22) for receiving said first output signals and for generating second input logic signals on a plurality of OR input lines;

OR logic plane means (14) for receiving said second input logic signals and for performing a second predetermined logic function thereon and for generating second output signals on a plurality of sum term lines;

said OR logic plane means (14) being formed of a plurality of N-channel OR plane programming transistors 26a, 26b, . . . 26n), each of said OR plane programming transistors having its drain electrode connected to a respective one of said plurality of sum term lines and its source electrode connected to the power supply ground potential (VSS);

said buffer means (22) being formed of a plurality of N-channel inter-plane FETs (23a, 23b, . . . 23n), each of said plurality of interplane FETs having its gate electrode coupled to a respective one of said plurality of product term lines and its source electrode connected to a respective one of said plurality of OR input lines, the drain electrodes of said plurality of inter-plane FETs being connected to receive an OR plane evaluation signal;

AND plane precharging means (30) coupled to said AND logic plane means (12) for precharging said plurality of product term lines during a precharging phase of an AND plane evaluation signal; and OR plane precharging means (36) coupled to said OR logic plane means (14) for precharging said plurality of sum term lines during a precharging phase of said OR plane evaluation signal.

7. A dynamic programmable logic array circuit as claimed in claim 6, wherein said AND plane precharging means (30) comprises a plurality of P-channel AND plane precharging transistors (32a, 32b, . . . 32m), each of said plurality of AND plane precharging transistors having its source electrode connected to a supply potential (VCC) and its drain electrode connected to a respective one of said plurality of product term lines, the gate electrodes of said plurality of AND plane precharging transistors being connected to receive said AND plane evaluation signal.

8. A dynamic programmable logic array circuit as claimed in claim 7, wherein said OR plane precharging means (36) comprises a plurality of P-channel OR plane precharging transistors (38a, 38b, . . . 38n), each of said plurality of OR plane precharging transistors having its source electrode connected to the supply potential (VCC) and its drain electrode connected to a respective one of said plurality of sum term lines, the gate electrodes of said plurality of OR plane precharging transistors being connected to receive said OR plane evaluation signal.

9. A dynamic programmable logic array circuit comprising:

AND logic plane means (12) for receiving input logic signals and performing predetermined logic operations thereon and for generating first output signals on a plurality of product term lines;

inter-plane buffer means (22) for receiving said first output signals and for generating second input logic signals on a plurality of OR input lines;

OR logic plane means (14) for receiving said second input logic signals and for performing a second predetermined logic function thereon and for generating second output signals on a plurality of sum term lines; and said buffer means (22) being formed of a plurality of N-channel inter-plane FETs (23a, 23b, . . . 23n), each of said plurality of interplane FETs having its gate electrode coupled to a respective one of said plurality of product term lines and its source electrode connected to a respective one of said plurality of OR input lines, the drain electrodes of said plurality of inter-plane FETs being connected to receive an OR plane evaluation signal.

* * * * *